United States Patent
Saito et al.

(10) Patent No.: US 7,303,789 B2
(45) Date of Patent: Dec. 4, 2007

(54) METHODS FOR PRODUCING THIN FILMS ON SUBSTRATES BY PLASMA CVD

(75) Inventors: Takao Saito, Nagoya (JP); Yukinori Nakamura, Nagoya (JP); Yoshimasa Kondo, Nagoya (JP); Naoto Ohtake, Yokosuka (JP)

(73) Assignee: NGK Insulators, Ltd., Nagoya (JP)

( * ) Notice: Subject to any disclaimer, the term of this patent is extended or adjusted under 35 U.S.C. 154(b) by 109 days.

(21) Appl. No.: 10/766,806

(22) Filed: Jan. 30, 2004

(65) Prior Publication Data

US 2004/0182323 A1    Sep. 23, 2004

Related U.S. Application Data

(60) Provisional application No. 60/457,310, filed on Mar. 26, 2003.

(30) Foreign Application Priority Data

Feb. 17, 2003  (JP) ............................. 2003-038767

(51) Int. Cl.
*H05H 1/24*    (2006.01)
(52) U.S. Cl. .................. 427/569; 427/577; 427/237
(58) Field of Classification Search ................ 427/569, 427/230, 237
See application file for complete search history.

(56) References Cited

U.S. PATENT DOCUMENTS

| | | | | |
|---|---|---|---|---|
| 4,837,185 A | * | 6/1989 | Yau et al. .................. 438/786 |
| 4,885,070 A | * | 12/1989 | Campbell et al. ....... 204/298.06 |
| 4,985,109 A | * | 1/1991 | Otsubo et al. .......... 156/345.41 |
| 5,093,151 A | * | 3/1992 | van den Berg et al. ...... 427/569 |
| 5,114,770 A | * | 5/1992 | Echizen et al. .............. 427/575 |
| 5,236,511 A | * | 8/1993 | Etzkorn et al. ....... 118/723 MW |
| 5,308,661 A | * | 5/1994 | Feng et al. .................. 427/535 |
| 5,614,273 A | * | 3/1997 | Goedicke et al. ............ 427/569 |
| 5,693,376 A | * | 12/1997 | Fetherston et al. .......... 427/523 |
| 5,731,048 A | * | 3/1998 | Ashe et al. .................. 427/585 |
| 6,489,585 B1 | * | 12/2002 | Nakamura et al. ...... 219/121.52 |
| 6,544,406 B1 | * | 4/2003 | Warren et al. ............. 208/48 R |
| 2002/0056415 A1 | * | 5/2002 | Mashima et al. ......... 118/723 E |
| 2002/0170495 A1 | * | 11/2002 | Nakamura et al. ........... 118/715 |
| 2002/0182319 A1 | | 12/2002 | Ben-Malek et al. | |

FOREIGN PATENT DOCUMENTS

JP   A 62-136569   6/1987
JP   A 2002-339072   11/2002

* cited by examiner

*Primary Examiner*—Bret Chen
(74) *Attorney, Agent, or Firm*—Oliff & Berridge, PLC

(57) ABSTRACT

Methods are provided to form a thin film reproducibly in a process for forming the thin film on the inner wall surface facing a space formed in a substrate by plasma CVD. A thin film is produced on an inner wall surface of a substrate facing a space formed in the substrate. The substrate is contained in a chamber for plasma CVD process. A gas for plasma reaction is then flown into the space and a pulse voltage is applied on the substrate without substantially applying a direct bias voltage on the substrate to form the thin film on the inner wall surface.

9 Claims, 3 Drawing Sheets

METHODS FOR PRODUCING THIN FILMS ON SUBSTRATES BY PLASMA CVD

This application is a non-provisional application of U.S. provisional application 60/457,310 filed on Mar. 26, 2003, and Japanese patent application 2003-38,767, filed on Feb. 17, 2003, the entireties of which are incorporated by reference.

BACKGROUND OF THE INVENTION

1. Field of the Invention

The present invention provides a method and system for forming a thin film on an inner wall surface of a substrate facing a space formed in the substrate by means of plasma CVD.

2. Related Art Statement

It has been known to form a hard film such as a diamond film or diamond like carbon film on a substrate to impart corrosion resistance to the substrate. Recently, it has been tried to form a hard film on an inner wall surface of a tubular body, whose applications include various products.

Such hard film is formed by so called plasma CVD process. According to the process, for example, a gaseous raw material such as methane gas is introduced with a carrier gas such as hydrogen gas into a furnace for plasma generating reaction. Such raw material gas is then excited by microwave or high frequency wave to generate plasma reaction gas, resulting in chemical reaction on the substrate. The plasma CVD process, however, is useful for forming a specific hard film uniformly on a plate shaped member or the other member having a simple shape. It is, however, difficult to form a hard film uniformly on a substrate having a complicated shape such as an inner wall surface of a tubular member, because the supply of the plasma reaction gas over the whole surface of the substrate tends to be insufficient.

According to Japanese patent publication 62-136,569A, an electrode of graphite is positioned inside of a tubular member, and it was tried to generate plasma reaction gas directly from a gaseous raw material inside of the tubular member. According to the process, a large amount of the plasma reaction gas can be introduced over the inner wall surface of the tubular member. It is thus possible to easily form a relatively thick and hard film uniformly on the inner wall surface of the tubular member.

According to the process described in Japanese patent publication 62-136, 569A, however, it is needed a graphite electrode smaller than the inner diameter of the tubular member. As the inner diameter of the tubular member is smaller, it becomes extremely difficult to produce a graphite electrode usable in the tubular member. Further, for producing hard films on the inner wall surfaces of a plurality of tubular members at the same time, it is needed to prepare a plurality of graphite electrodes each corresponding with each tubular member. The design of a system for plasma CVD becomes thus complicated so that the production of the hard films is made rather complicated.

According to Japanese patent publication 2002-339, 072A, a difference of pressure is generated between the upstream and downstream of the tubular member so that a gas for plasma reaction is flown into the inner space of the tubular member. A DC bias voltage and pulse voltage are applied on the tubular member so that a thin film is successfully formed on the inner wall surface of the tubular member.

SUMMARY OF THE INVENTION

The technique described in Japanese patent publication 2002-339, 072A is superior in that a thin film having excellent quality can be formed without inserting an electrode into the inner space in the tubular member. The inventors have studied the technique further, and found that the plasma reaction gas cannot be passed through the space in the tubular member easily as the inner diameter of the tubular member is smaller. The amount of supply of the reaction gas into the space becomes thus smaller, so that the formation of the thin film is made difficult and the quality of the film may be deteriorated. Further, when an end of the tubular member is sealed, the reaction gas is prevented from flowing in the inner space of the tubular member. The amount of supply of the gas for plasma reaction is thus made small so that the formation of the thin film is made difficult and the quality of the film may be deteriorated.

An object of the present invention is to form a thin film reproducibly in a process for forming the thin film on the inner wall surface facing a space in a substrate by plasma CVD.

The present invention provides a method of producing a thin film on an inner wall surface of a substrate facing a space formed in the substrate. The method has the steps of:

providing the substrate in a chamber for plasma CVD (chemical vapor deposition) process; and flowing a gas for plasma reaction into the space and applying a pulse voltage on the substrate without substantially applying a direct bias voltage on the substrate to from the thin film on the inner wall surface.

The present invention further provides a system for producing a thin film on an inner wall surface of a substrate facing a space formed in the substrate. The system has a chamber for plasma CVD and for containing the substrate, a supply hole for supplying a gas for plasma reaction to the chamber, and a means for applying a pulse voltage on the substrate. The gas is flown into the space and the means applies a pulse voltage on the substrate without substantially applying a direct bias voltage on the substrate to from the thin film on the inner wall surface.

The inventors have found the followings. That is, even when the diameter of the space is small, or when the space is sealed, the thin film can be reproducibly formed by applying a pulse voltage by the pulse voltage applying means without substantially applying a direct bias voltage on the substrate.

It has been common to apply a direct bias voltage on a substrate in a process for applying a pulse voltage on the substrate to generate plasma of a reaction gas so that a CVD film is formed. Contrary to this, a thin film can be reproducibly formed by applying a pulse voltage by a pulse voltage applying means without substantially applying a direct bias voltage on a substrate, even when the diameter of the space is small or when the space is sealed, according to the present invention. Such discovery is beyond the expectation of those who skilled in the art.

These and other objects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

Figure 1:
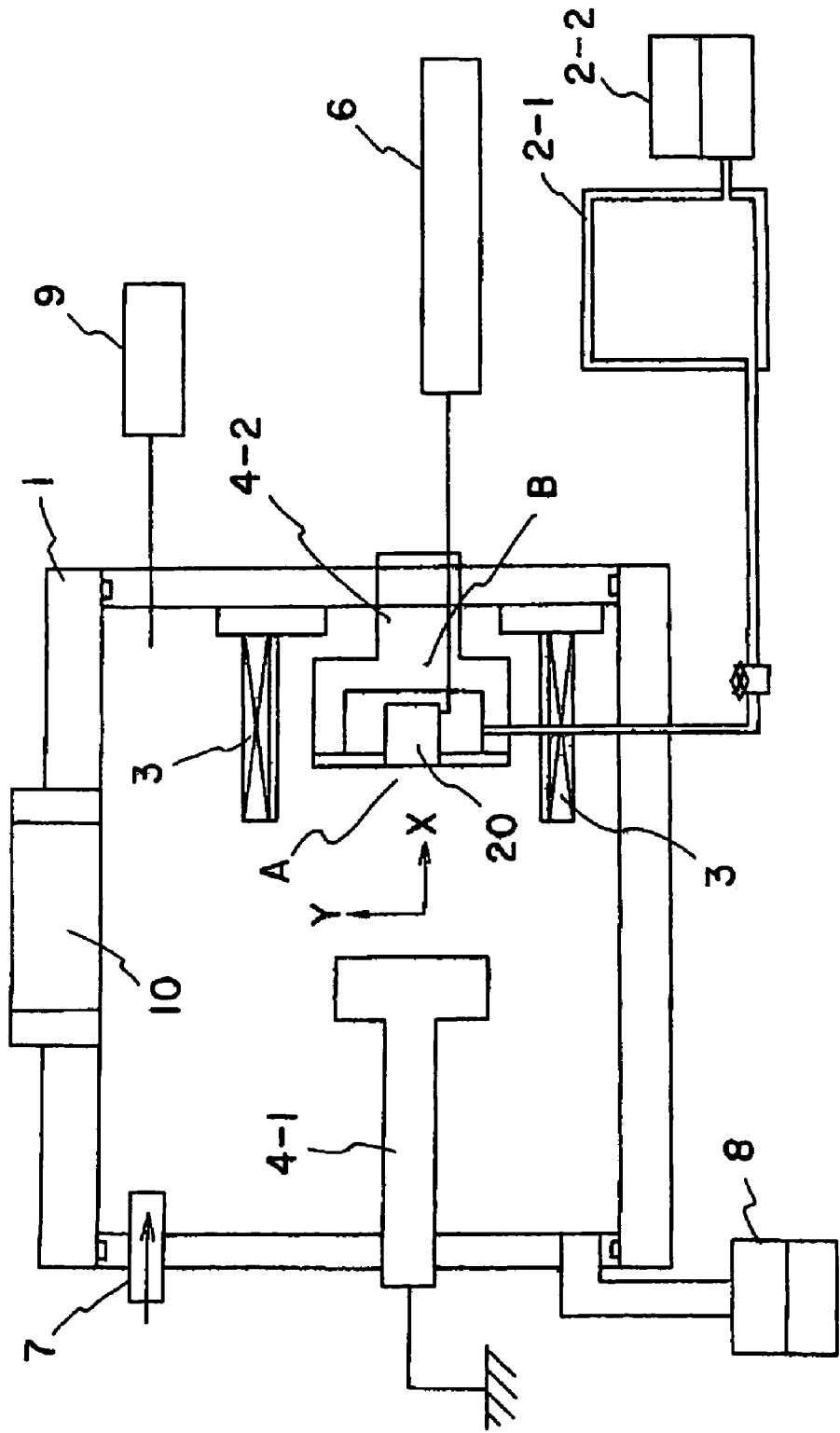
FIG. 1 is a block diagram schematically showing a system for forming a thin film, according to one embodiment of the present invention.

In the invention, a thin film is formed on the inner wall surface facing a space of a substrate by plasma CVD process. The shape and dimension of the space are not particularly limited. Further, the substrate may preferably be tubular or cylindrical. A tubular or cylindrical member has one elongate space formed therein extending in the length of the member. The substrate is not, however, limited to such tubular or cylindrical member. For example, a plurality of spaces may be formed in one substrate.

The diameter of the space (inner diameter of the substrate) is not particularly limited. As the diameter of the space is larger, it becomes easier to form a thin film on the inner wall surface facing the space. The upper limit of the space is not thus particularly defined. On the other hand, when the diameter of the space is 10 mm or smaller, it has been generally difficult to form a thin film on the inner wall surface facing the space in a prior art. The present invention is particularly useful in this case. On the viewpoint, the present invention is most useful when the diameter of the space is 3 mm or smaller. Although the lower limit of the diameter of the space is not particularly defined, the present invention is useful for forming a thin film on the inner wall surface facing the space having a diameter of, for example, 0.001 mm or larger, and preferably 0.01 mm or larger.

The electric field in the substrate applied by the pulse voltage is not particularly limited. The electric field may preferably be 20 to 300 kV/m, and more preferably be 20 to 200 kV/m.

The pulse width of the pulse voltage is not particularly limited, and may preferably be 1 μs to 50 μs.

the pulse period of the pulse voltage is not particularly limited, and may preferably be 100 Hz to 10000 Hz.

According to the present invention, the pulse voltage is applied without substantially applying a direct current bias voltage on the substrate. In other words, an operation is not performed for applying a direct current bias voltage on the substrate by an electric source having a capability of applying a direct current bias voltage. A direct current electric potential may be induced between a cathode and the anode due to a reason other than the direct current bias voltage. This embodiment is, however, encompassed by the present invention, because a direct current bias voltage is not applied by an electric source.

In a preferred embodiment, a difference of pressure is generated in the longitudinal direction of the substrate to facilitate the flow of the plasma reaction gas into the space of the substrate. The pressure difference may be generated by any method not particularly limited. In one embodiment, a means for generating a magnetic field is provided, so that a magnetic field is generated in the longitudinal direction, or the width of the substrate. The plasma reaction gas is captured by means of the magnetic field and flown into the space of the substrate.

In another embodiment of the present invention, a mechanism for discharging gas is provided so that a difference of pressure is generated in the longitudinal direction of the substrate. It is thus possible to facilitate the flow of the plasma reaction gas into the space of the substrate.

FIG. 1 is a block diagram showing a system for producing a thin film according to one embodiment of the present invention. The system for producing a thin film shown in FIG. 1 has a chamber 1 for forming a film, and a means for generating a pressure difference composed of a tank 2-1 for controlling pressure and a pump 2-2. The system further has a coil 3 as a means for generating a magnetic field, and a means for generating an electric field composed of an anode 4-1 and a cathode 4-2. The anode 4-1 is ground, and the cathode 4-2 is connected with a source 6 for high voltage pulse. An electric source for direct current voltage is not provided.

Further, a gas supply hole 7 for introducing a gaseous raw material and a pump 8 for maintaining a pressure in the chamber 1 at a predetermined value are provided in the chamber 1. Further, a pressure gauge 9 and a window 10 are provided. It is thus possible to monitor the degree of vacuum and the state of the plasma reaction gas in the chamber 1. A substrate 20 is provided and fixed over the cathode 4-2.

After the chamber 1 is evacuated with the pump 8 to a predetermined degree of vacuum, the gaseous raw material is supplied into the chamber 1 through the gas supply hole 7. The pressure in the chamber 1 is maintained at a predetermined value by the evacuation with the pump 8. The degree of vacuum is monitored by means of the pressure gauge 9 provided in the chamber 1.

The source 6 for applying high voltage pulse then applies a pulse voltage to excite the gaseous raw material to generate plasma reaction gas.

The space around the cathode 4-2 and substrate 20 set on the cathode is evacuated by means of the pump 2-2 through the tank 2-1 for controlling a pressure, so as to generate a difference or gradient of pressure in the longitudinal direction "X" of the substrate 20. The pressure at a rear part B in the longitudinal direction X of the substrate 20 may preferably be $\frac{1}{10}$ or lower, and more preferably be $\frac{1}{100}$ or lower, of a pressure at a front part A in the longitudinal direction X. It is thus possible to introduce the plasma reaction gas efficiently into the space of the substrate 20.

In a preferred embodiment, the pressure in the chamber 1 is about $10^{-2}$ Torr and the pressure at the front part A in the longitudinal direction X of the substrate 20 is also about $10^{-2}$ Torr. In this case, the pressure at the rear part B in the longitudinal direction X of the tubular member 20 is controlled at a value of about $10^{-3}$ to $10^{-4}$ Torr by means of the tank 2-1 for controlling pressure and pump 2-2.

A current is flown to the coil 3 to generate a magnetic field in the longitudinal direction X of the substrate 20. The magnetic field may preferably be focused so that the width of the magnetic field is smaller than the inner diameter of the substrate 20 in the direction Y perpendicular to the longitudinal direction X of the substrate 20. It is thus possible to improve the flow ratio of the plasma reaction gas into the substrate 20 to facilitate the formation of the thin film onto the inner wall surface facing the space of the substrate 20.

Figure 2:
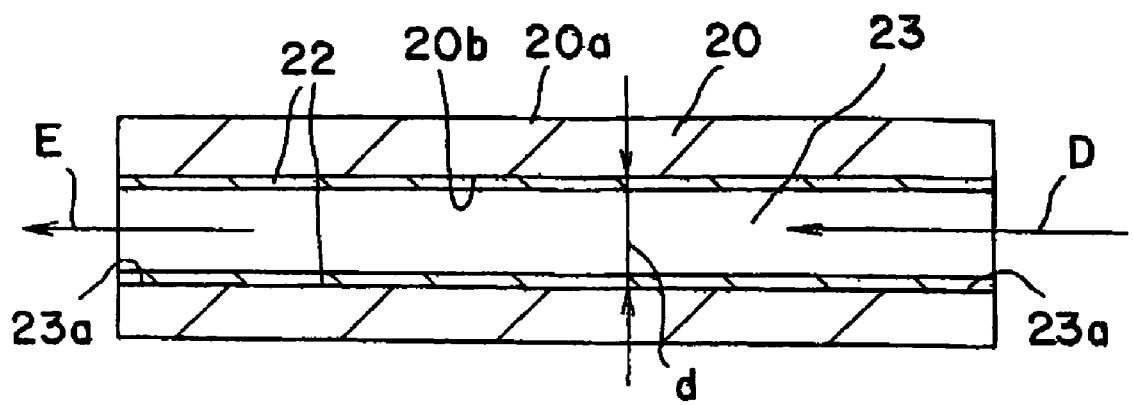
FIG. 2(a) is a cross sectional view showing a tubular member 20, a space 23, and a thin film 22 formed on the inner wall surface facing the space 23.
FIG. 2(b) is a cross sectional view showing a tuba member 20A, a space 23A, and a thin film 22 formed on the inner wall surface facing the space 23A.
FIG. 2(c) is a cross sectional view showing a tubular member 20B, a space 23B, and a thin film 22 formed on the inner wall surface facing the space 23B.
Figure 2:
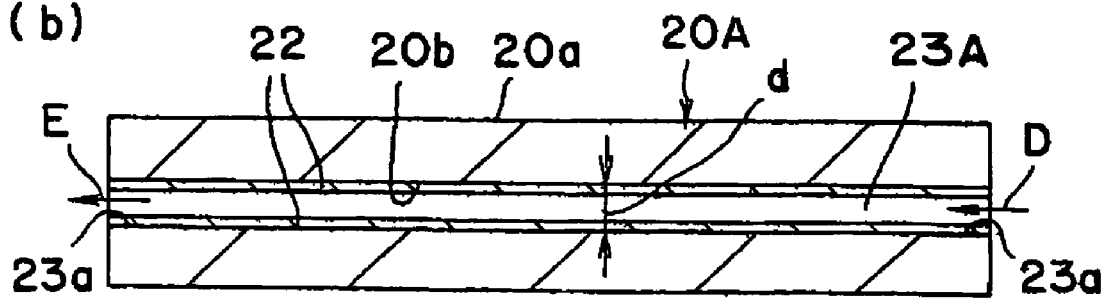
Figure 2:
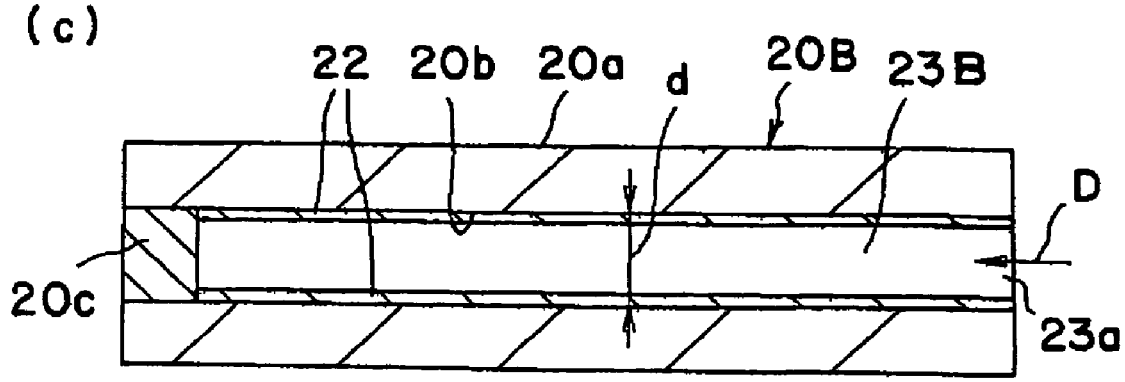

FIGS. 2(a), 2(b) and 2(c) are cross sectional views each showing a thin film 22 formed on each tubular substrate 20, 20A or 20B.

The substrate 20 shown in FIG. 2(a) has a relatively large inner diameter (diameter of a space 23) "d", so that the plasma reaction gas easily passes through the space 23 as arrows D and E. 23a represents an opening communicating with the space. The substrate 20A shown in FIG. 2(b) has a smaller inner diameter (diameter of a space 23A) "d" compared with that in FIG. 2(a). A pressure loss before the gas is discharged as an arrow E is larger when the gas is flown into the space as an arrow D. It may be difficult to form a thin film efficiently according to a prior process. In the substrate 20B shown in FIG. 2(c), a sealing part 20c is provided in the downstream of the gas flow to prevent the flow of the gas into the space 23B. The present invention is still effective for forming a thin film on the inner wall surface.

Further, the kind of the thin film formed on the inner wall surface of the substrate is not particularly limited, and includes diamond, diamond like carbon, TiN, TiCN, WC, $W_2C$, $W_3C$, $SiO_2$, SiNx, a-Si:H, BCN, BN, CN or the like.

In a preferred embodiment, the thin film is made of diamond or diamond like carbon. Such substrate may be used as a sliding member.

EXAMPLES

A film 22 of diamond like carbon was formed on the inner wall surface 20b of the substrate 20B as shown in FIG. 2(c), according to the process described above referring to FIG. 1. Specifically, the outer diameter of the substrate 20B was 5 mm, the inner diameter was 0.9 mm, and the length was 20 mm.

The substrate 20B was mounted and fixed on the cathode 4-2, and the inside of the chamber 1 was evacuated to a degree of vacuum of $1\times10^{-4}$ to $1\times10^{-5}$ Torr by means of the pump 8. $C_2H_2$ gas was introduced at a flow rate of 20 cm$^3$/min through the gas supply hole 7, and the pressure in the chamber 1 was maintained at $3.75\times10^{-2}$ Torr by controlling the evacuation with the pump 8. 8.0 kV of the pulse voltage was applied between the anode 4-1 and cathode 4-2 with the high voltage pulse source 6 to generate $C_2H_2$ gas plasma. A distance between the anode 4-1 and cathode 4-2 was 10 cm, so that an electric field of 80 kV/m was generated between the anode 4-1 and cathode 4-2. The pulse width of the pulse voltage was 20 μsec, and the pulse period was 5000 Hz.

The pressure at the rear part "B" in the longitudinal direction X of the substrate 20 was adjusted at $4.5\times10^{-4}$ Torr using the tank 2-1 for controlling pressure and pump 2-2. Further, a current is flown into the coil 3 to generate a magnetic field of 0.01 T in the longitudinal direction X of the substrate. The pressure and magnetic field were maintained for 15 minutes and $C_2H_2$ plasma gas was introduced to the space 23B of the substrate. A diamond like carbon film was thus generated on the inner wall surface 20b.

Figure 3:
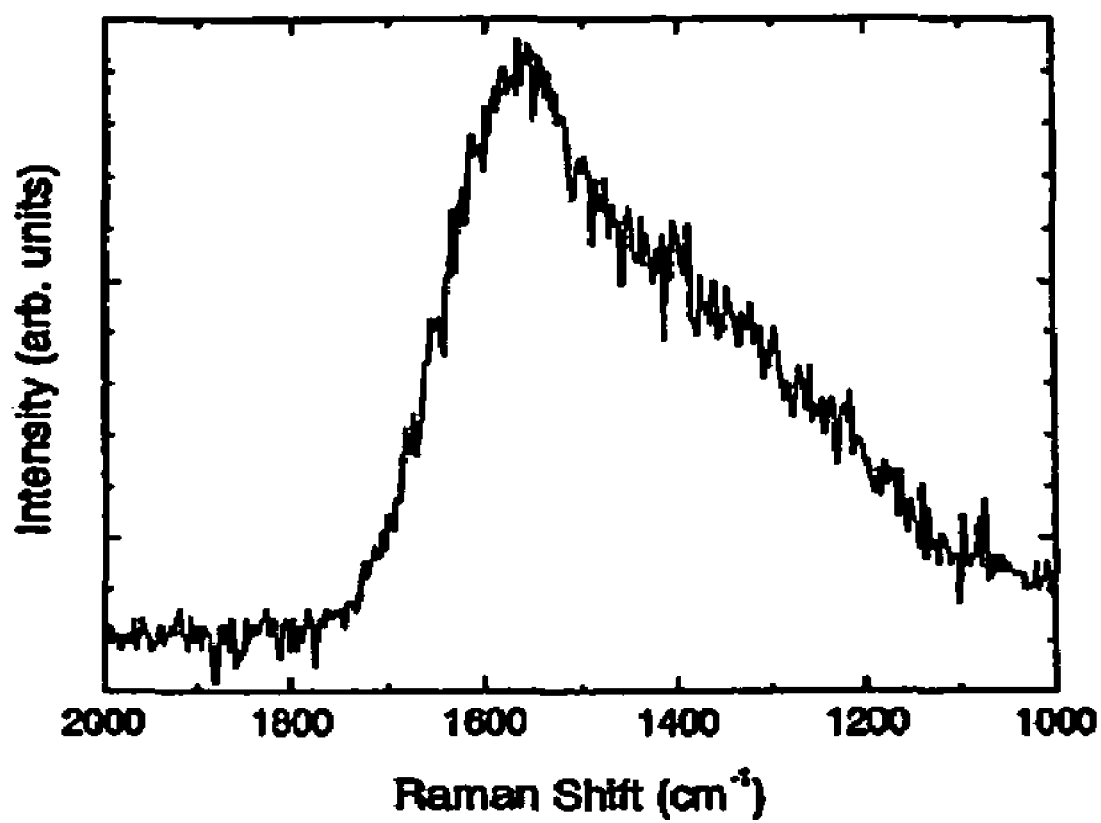
FIG. 3 is a graph showing a Raman spectrum obtained by Raman spectroscopic analysis of a diamond like carbon film formed on the inner wall surface of a substrate.

FIG. 3 is a graph showing a Raman spectrum obtained by Raman spectroscopic analysis of a diamond like carbon film formed on the inner wall surface of the substrate. As can be seen from FIG. 3, characteristic scattering peaks near about 1360 cm$^{-1}$ and 1580 cm$^{-1}$ were observed due to diamond like carbon. It was thus proved the presence of a film of diamond like carbon.

As described above, a thin film can be reproducibly formed in a process for forming the thin film on the inner wall surface facing a space formed in a substrate by plasma CVD.

The present invention has been explained referring to the preferred embodiments. However, the present invention is not limited to the illustrated embodiments which are given by way of examples only, and may be carried out in various modes without departing from the scope of the invention.

The invention claimed is:

1. A method of producing a thin film by plasma CVD on an inner wall surface of a substrate, said substrate having an inner wall, said method comprising the steps of:
    providing said substrate in a chamber for plasma CVD; and
    flowing a gas for plasma reaction over said inner wall surface and applying a pulse voltage from a high voltage pulse source on said substrate without substantially applying a DC bias voltage source on said substrate to form said thin film on said inner wall surface, wherein the high voltage pulse source applies an electric field in a range of 20 to 300 kV/m, said inner wall faces an inner space of said substrate, and the inner space has a diameter of 0.9 mm or smaller.

2. The method of claim 1, wherein a difference of a pressure is generated in the longitudinal direction of said substrate.

3. The method of claim 1, wherein said substrate has one opening therein communicating with said space.

4. The method of claim 1, wherein said thin film comprises diamond or diamond like carbon.

5. The method of claim 1, applying the pulse voltage being performed without accelerating ions.

6. The method of claim 1, wherein the substrate is a substantially tubular structure.

7. The method of claim 1, wherein the high voltage pulse source applies an electric field in a field of 20 to 200 kV/m.

8. The method of claim 1, wherein the high voltage pulse source has a pulse width in a field of 1 to 50 μs.

9. The method of claim 1, wherein the high voltage pulse source has a pulse period in a range of 100 to 10,000 Hz.

* * * * *